United States Patent
Borkenhagen et al.

(10) Patent No.: US 11,693,446 B2
(45) Date of Patent: Jul. 4, 2023

(54) ON-CHIP SPREAD SPECTRUM SYNCHRONIZATION BETWEEN SPREAD SPECTRUM SOURCES

(71) Applicant: INTERNATIONAL BUSINESS MACHINES CORPORATION, Armonk, NY (US)

(72) Inventors: John Borkenhagen, Rochester, MN (US); Christopher Steffen, Rochester, MN (US); Grant P. Kesselring, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 51 days.

(21) Appl. No.: 17/506,172

(22) Filed: Oct. 20, 2021

(65) Prior Publication Data
US 2023/0121692 A1    Apr. 20, 2023

(51) Int. Cl.
G06F 1/12      (2006.01)
H03K 5/14      (2014.01)
H03L 7/08      (2006.01)

(52) U.S. Cl.
CPC .............. G06F 1/12 (2013.01); H03K 5/14 (2013.01); H03L 7/08 (2013.01)

(58) Field of Classification Search
CPC .............. G06F 1/32; G06F 1/12; G06F 9/44
See application file for complete search history.

(56) References Cited

U.S. PATENT DOCUMENTS

| | | | |
|---|---|---|---|
| 4,216,354 | A | 8/1980 | Esteban et al. |
| 4,790,015 | A | 12/1988 | Callens et al. |
| 4,933,957 | A | 6/1990 | Bottau et al. |
| 5,446,767 | A | 8/1995 | Nakagawa et al. |
| 5,448,569 | A | 9/1995 | Huang et al. |
| 5,507,035 | A | 4/1996 | Bantz et al. |
| 5,515,366 | A | 5/1996 | Chieu et al. |

(Continued)

FOREIGN PATENT DOCUMENTS

| | | |
|---|---|---|
| WO | 0021237 A1 | 4/2000 |
| WO | 2001037428 A1 | 5/2001 |
| WO | 2021209850 A1 | 10/2021 |

OTHER PUBLICATIONS

IBM Appendix P, "List of IBM Patents or Patent Applications to be Treated as Related", Oct. 20, 2021, 2 pages.

(Continued)

*Primary Examiner* — Keshab R Pandey
(74) *Attorney, Agent, or Firm* — Nathan M. Rau

(57) ABSTRACT

On-chip spread spectrum synchronization between spread spectrum sources is provided. A spread spectrum amplitude of a signal of a spread spectrum reference clock is obtained using one or more delay lines of one or more delay elements in a skitter circuit. A spread width of the spread spectrum amplitude of the signal is determined, using one or more sticky latches in the skitter circuit, based on one or more edges of the signal. A delay line of the one or more delay elements corresponding to a falling edge of the spread width of the signal is identified using combinational circuitry of the skitter circuit. A spread spectrum signal of a spread spectrum slave clock is synchronized with the signal of the spread spectrum reference clock based on the delay line.

20 Claims, 11 Drawing Sheets

(56) References Cited

U.S. PATENT DOCUMENTS

| | | | |
|---|---|---|---|
| 5,533,025 | A | 7/1996 | Fleek et al. |
| 5,757,870 | A | 5/1998 | Miya et al. |
| 5,774,494 | A | 6/1998 | Sawahashi et al. |
| 5,943,329 | A | 8/1999 | Ohgoshi et al. |
| 6,011,546 | A | 1/2000 | Bertram |
| 6,115,676 | A | 9/2000 | Rector et al. |
| 6,175,860 | B1 | 1/2001 | Gaucher |
| 6,243,413 | B1 | 6/2001 | Beukema |
| 6,289,213 | B1 | 9/2001 | Flint et al. |
| 6,292,507 | B1 | 9/2001 | Hardin et al. |
| 6,314,128 | B1 | 11/2001 | Bunker et al. |
| 6,393,049 | B1 | 5/2002 | Davidovici et al. |
| 6,405,261 | B1 | 6/2002 | Gaucher |
| 6,526,385 | B1 | 2/2003 | Kobayashi et al. |
| 6,741,636 | B1 | 5/2004 | Lender |
| 6,775,342 | B1 | 8/2004 | Young et al. |
| 6,802,033 | B1 | 10/2004 | Bertin et al. |
| 6,973,145 | B1 | 12/2005 | Smith et al. |
| 7,043,206 | B2 | 5/2006 | Herdey et al. |
| 7,050,478 | B1 | 5/2006 | Weekly |
| 7,164,368 | B1 | 1/2007 | Ireland |
| 7,187,705 | B1 | 3/2007 | Richmond |
| 7,339,364 | B2 | 3/2008 | Kam et al. |
| 7,389,095 | B1 | 6/2008 | Liu et al. |
| 7,501,865 | B1 | 3/2009 | Jacobowitz et al. |
| 7,742,556 | B1 | 6/2010 | Qian et al. |
| 7,750,713 | B2 | 7/2010 | Oh |
| 7,944,229 | B2 | 5/2011 | Joshi et al. |
| 8,072,253 | B2 | 12/2011 | Kaeriyama et al. |
| 8,090,888 | B2 | 1/2012 | Milan et al. |
| 8,253,502 | B2 | 8/2012 | Kanda |
| 8,284,816 | B1 | 10/2012 | Clementi |
| 8,473,233 | B1 | 6/2013 | Giust |
| 9,081,501 | B2 | 7/2015 | Asaad et al. |
| 9,209,966 | B1 | 12/2015 | Hossain et al. |
| 9,450,641 | B2 | 9/2016 | Chung et al. |
| 9,639,114 | B2 | 5/2017 | Shirai |
| 9,804,231 | B2 | 10/2017 | Eckert et al. |
| 10,446,937 | B2 | 10/2019 | Vannucci et al. |
| 10,466,289 | B2 | 11/2019 | Lee et al. |
| 11,146,307 | B1 | 10/2021 | Borkenhagen et al. |
| 2001/0014114 | A1 | 8/2001 | Baltersee et al. |
| 2001/0052871 | A1 | 12/2001 | Fukae et al. |
| 2004/0095020 | A1 | 5/2004 | Kernahan et al. |
| 2004/0095081 | A1 | 5/2004 | Kernahan |
| 2004/0095108 | A1 | 5/2004 | Kernahan et al. |
| 2004/0095112 | A1 | 5/2004 | Kernahan et al. |
| 2004/0095116 | A1 | 5/2004 | Kernahan et al. |
| 2004/0095164 | A1 | 5/2004 | Kernahan et al. |
| 2004/0095264 | A1 | 5/2004 | Thomas |
| 2004/0128591 | A1 | 7/2004 | Ihs et al. |
| 2004/0257124 | A1 | 12/2004 | Araki et al. |
| 2005/0013343 | A1 | 1/2005 | Giunco et al. |
| 2007/0063755 | A1 | 3/2007 | Gilliland |
| 2007/0091986 | A1 | 4/2007 | Wu |
| 2007/0290894 | A1* | 12/2007 | Ng .................. H02M 3/157 |
| | | | 341/50 |
| 2008/0198945 | A1 | 8/2008 | Egan et al. |
| 2008/0265957 | A1 | 10/2008 | Luong et al. |
| 2009/0135885 | A1 | 5/2009 | Lin |
| 2010/0027585 | A1 | 2/2010 | Jeanson et al. |
| 2010/0061424 | A1 | 3/2010 | Germann et al. |
| 2010/0090732 | A1 | 4/2010 | Lee et al. |
| 2010/0166039 | A1 | 7/2010 | Jeon et al. |
| 2010/0218042 | A1 | 8/2010 | Milan et al. |
| 2011/0169582 | A1 | 7/2011 | Kim et al. |
| 2011/0199138 | A1 | 8/2011 | Sano |
| 2011/0219208 | A1 | 9/2011 | Asaad et al. |
| 2013/0141076 | A1 | 6/2013 | Zhang |
| 2013/0182747 | A1 | 7/2013 | Nakamura et al. |
| 2014/0159787 | A1 | 6/2014 | Hsu |
| 2014/0233744 | A1 | 8/2014 | Risberg et al. |
| 2014/0269848 | A1 | 9/2014 | Schrom et al. |
| 2015/0015426 | A1 | 1/2015 | Lindahl et al. |
| 2016/0011996 | A1 | 1/2016 | Asaad et al. |
| 2016/0182075 | A1 | 6/2016 | Devarajan et al. |
| 2017/0033707 | A1 | 2/2017 | Nishijima |
| 2017/0286359 | A1* | 10/2017 | McGowan .......... G06F 13/4291 |
| 2018/0069554 | A1 | 3/2018 | Chen et al. |
| 2019/0377026 | A1 | 12/2019 | Steffen et al. |
| 2021/0320686 | A1 | 10/2021 | Borkenhagen et al. |

OTHER PUBLICATIONS

International Search Report and Written Opinion, PCT/IB2021/052736, dated Jul. 8, 2021, 7 pages.

Li et al., "AC 2011-409: Measuring the Jitter of Clock Signal", American Society for Engineering Education, URL: https://www.asee.org/public/conferences/1/papers/409/download (online), dated 2011, printed May 11, 2018, 12 pages.

Tektronix, "Characterizing and Troubleshooting Jitter with Your Oscilloscope", Entest, Inc. (online), accessed Feb. 20, 2020, 14 pages, URL: http://www.entestinc.com/media/app-notes/55W-61099-0_TS-Jitter_AN_02.pdf.

U.S. Appl. No. 16/846,991, to John Borkenhagen et al., entitled, Detecting Distortion In Spread Spectrum Signals, assigned to International Business Machines Corporation, 28 pages, filed Apr. 13, 2020.

Zimmer et al., "Spread Spectrum Frequency Modulation Reduces EMI", Technical Article, Analog Devices, 5 pages, retrieved May 26, 2021 (online), URL: www.analog.com/media/en/technical-documentation/tech-articles/Spread-Spectrum-Frequency-Modulation-Reduces-EMI.pdf.

International Search Report and Written Opinion, PCT/EP2022/078318, dated Feb. 20, 2023, 12 pages.

* cited by examiner

ON-CHIP SPREAD SPECTRUM SYNCHRONIZATION BETWEEN SPREAD SPECTRUM SOURCES

BACKGROUND

Field of the Invention

The field of the invention is data processing, or, more specifically, methods, apparatus, and products for on-chip spread spectrum synchronization between spread spectrum sources.

Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

SUMMARY

According to an embodiment of the present disclosure, a method for on-chip spread spectrum synchronization between spread spectrum sources is provided. A spread spectrum amplitude of a signal of a spread spectrum reference clock is obtained using one or more delay lines of one or more delay elements in a skitter circuit. A spread width of the spread spectrum amplitude of the signal is determined, using one or more sticky latches in the skitter circuit, based on one or more edges of the signal. A delay line of the one or more delay elements corresponding to a falling edge of the spread width of the signal is identified using combinational circuitry of the skitter circuit. A spread spectrum signal of a spread spectrum slave clock is synchronized with the signal of the spread spectrum reference clock based on the delay line.

An embodiment includes a computer usable program product. The computer usable program product includes a computer-readable storage device, and program instructions stored on the storage device.

An embodiment includes a computer system. The computer system includes a processor, a computer-readable memory, and a computer-readable storage device, and program instructions stored on the storage device for execution by the processor via the memory.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION

Figure 1:
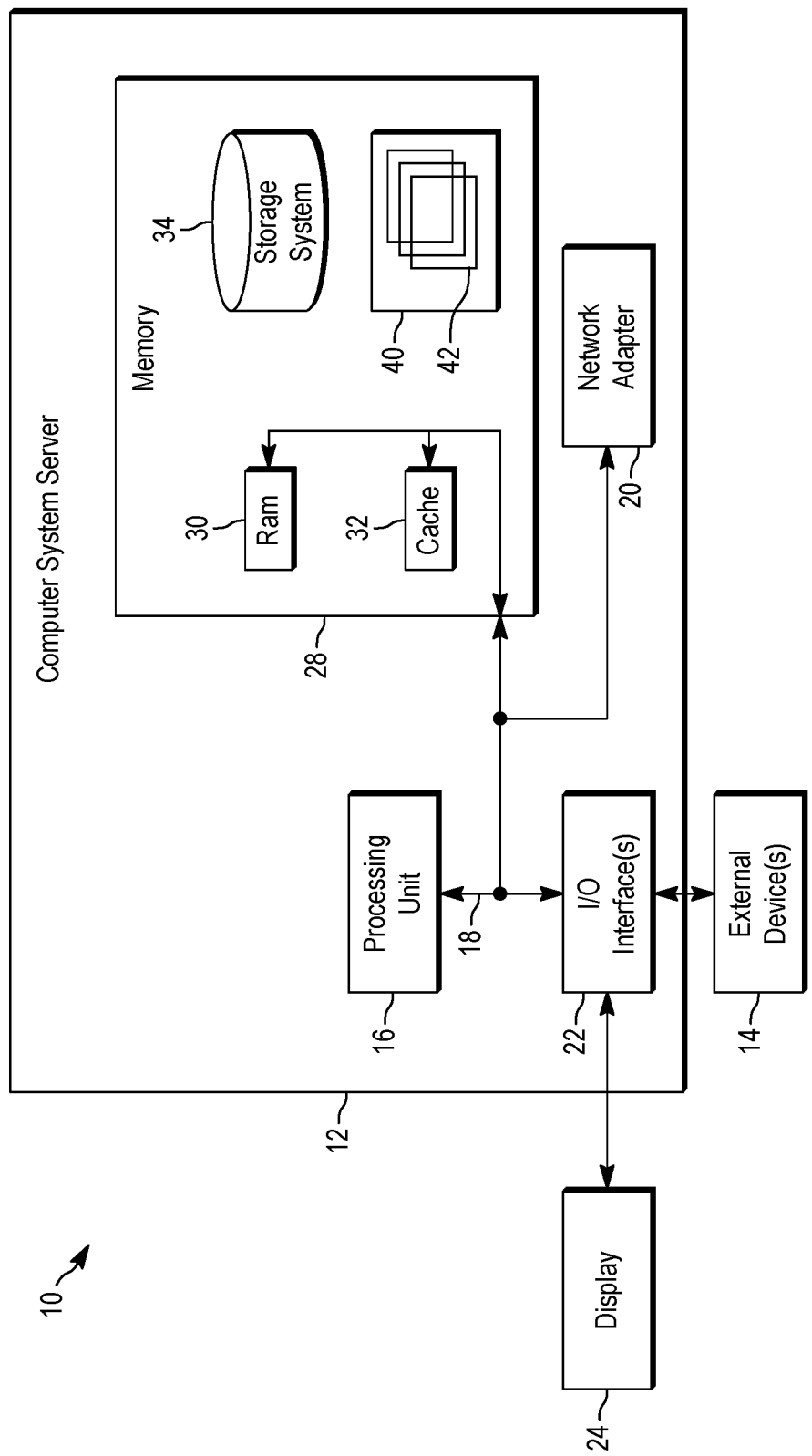
FIG. 1 is a block diagram depicting an exemplary cloud computing node in accordance with some embodiments of the present disclosure.

In current computing server designs, many systems use spread spectrum clocking to reduce electromagnetic interference (EMI). Spread spectrum reduces EMI by deliberately spreading a signal in a frequency domain to distribute power across a wider bandwidth. In many cases, spread spectrum clocking is generated on die and needs to be synchronized with other spread spectrum sources. Currently, some resources achieves synchronization by simultaneously enabling spread spectrum for all sources using a shared Time Of Day ("TOD") clock. The TOD clock must be routed and timed to ensure it is synchronous for all spread spectrum sources. Accordingly, a need exists to synchronize spread spectrum sources asynchronously and without the need for a shared TOD clock.

An embodiment is directed to a method for on-chip spread spectrum synchronization between spread spectrum sources. The method includes obtaining, using one or more delay lines of one or more delay elements in a skitter circuit, a spread spectrum amplitude of a signal of a spread spectrum reference clock. The method also includes determining, using one or more sticky latches in the skitter circuit, a spread width of the spread spectrum amplitude of the signal based on one or more edges of the signal. The method also includes identifying a delay line of the one or more delay elements corresponding to a falling edge of the spread width of the signal using combinational circuitry of the skitter circuit. The method also includes synchronizing a spread spectrum signal of a spread spectrum slave clock with the signal of the spread spectrum reference clock based on the delay line.

In some implementations, the method also includes identifying, based on the signal of the spread spectrum reference clock, the one or more edges in the signal of the spread spectrum reference clock. In some implementations, the method also includes providing the one or more edges of the signal to one or more sticky latches. In some implementations, the falling edge corresponds to a center frequency of a center spread of the spread width of the signal of the spread spectrum reference clock.

In some implementations, synchronizing the spread spectrum signal of the spread spectrum slave clock with the signal of the spread spectrum reference clock based on the delay line further includes waiting for the spread width of the signal of the spread spectrum reference clock to reach a center frequency to capture the spread width. In some implementations, synchronizing the spread spectrum signal of the spread spectrum slave clock with the signal of the spread spectrum reference clock based on the delay line further includes initiating an upward rise of the spread spectrum signal of the spread spectrum slave clock at a center frequency of a center spread of the spread width based on the signal of the spread spectrum reference clock reaching the center frequency. In some implementations, the method also includes resetting the one or more sticky latches containing the spread width.

Another embodiment is directed to an apparatus (e.g., an integrated circuit) for on-chip spread spectrum synchronization between spread spectrum sources. The apparatus comprises a computer processor, a computer memory operatively coupled to the computer processor, the computer memory having disposed therein computer program instructions that, when executed by the computer processor, cause the apparatus to obtain, using one or more delay lines of one or more delay elements in a skitter circuit, a spread spectrum amplitude of a signal of a spread spectrum reference clock. The computer program instructions also cause the apparatus to determine, using one or more sticky latches in the skitter circuit, a spread width of the spread spectrum amplitude of the signal based on one or more edges of the signal. The computer program instructions also cause the apparatus to obtain, using one or more delay lines of one or more delay elements in a skitter circuit, a spread spectrum amplitude of a signal of a spread spectrum reference clock. The computer program instructions also cause the apparatus to identify a delay line of the one or more delay elements corresponding to a falling edge of the spread width of the signal using combinational circuitry of the skitter circuit. The computer program instructions also cause the apparatus to synchronize a spread spectrum signal of a spread spectrum slave clock with the signal of the spread spectrum reference clock based on the delay line. The computer program instructions also cause the apparatus to identify, based on the signal of the spread spectrum reference clock, the one or more edges in the signal of the spread spectrum reference clock.

The computer program instructions also cause the apparatus to provide the one or more edges of the signal to one or more sticky latches. The falling edge corresponds to a center frequency of a center spread of the spread width of the signal of the spread spectrum reference clock.

In some implementations, synchronizing the spread spectrum signal of the spread spectrum slave clock with the signal of the spread spectrum reference clock based on the delay line also includes waiting for the spread width of the signal of the spread spectrum reference clock to reach a center frequency to capture the spread width, and initiating an upward rise of the spread spectrum signal of the spread spectrum slave clock at the center frequency of the center spread of the spread width based on the signal of the spread spectrum reference clock reaching the center frequency. The computer program instructions also cause the apparatus to reset the one or more sticky latches containing the spread width.

Yet another embodiment is directed to a computer program product for on-chip spread spectrum synchronization between spread spectrum sources. The computer program product is disposed upon a computer readable medium and comprises computer program instructions that, when executed, cause a computer to obtain, using one or more delay lines of one or more delay elements in a skitter circuit, a spread spectrum amplitude of a signal of a spread spectrum reference clock. The computer program instructions also cause the computer to determine, using one or more sticky latches in the skitter circuit, a spread width of the spread spectrum amplitude of the signal based on one or more edges of the signal. The computer program instructions also cause the computer to obtain, using one or more delay lines of one or more delay elements in a skitter circuit, a spread spectrum amplitude of a signal of a spread spectrum reference clock. The computer program instructions also cause the computer to identify a delay line of the one or more delay elements corresponding to a falling edge of the spread width of the signal using combinational circuitry of the skitter circuit. The computer program instructions also cause the computer to synchronize a spread spectrum signal of a spread spectrum slave clock with the signal of the spread spectrum reference clock based on the delay line. The computer program instructions also cause the computer to identify, based on the signal of the spread spectrum reference clock, the one or more edges in the signal of the spread spectrum reference clock.

The computer program instructions also cause the computer to provide the one or more edges of the signal to one or more sticky latches. The falling edge corresponds to a center frequency of a center spread of the spread width of the signal of the spread spectrum reference clock.

In some implementations, synchronizing the spread spectrum signal of the spread spectrum slave clock with the signal of the spread spectrum reference clock based on the delay line also includes waiting for the spread width of the signal of the spread spectrum reference clock to reach a center frequency to capture the spread width, and initiating an upward rise of the spread spectrum signal of the spread spectrum slave clock at the center frequency of the center spread of the spread width based on the signal of the spread spectrum reference clock reaching the center frequency. The computer program instructions also cause the computer to reset the one or more sticky latches containing the spread width.

It is understood in advance that although this disclosure includes a detailed description on cloud computing, implementation of the teachings recited herein are not limited to a cloud computing environment. Rather, embodiments of the present disclosure are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Referring now to FIG. 1, a schematic of an example of a cloud computing node is shown. Cloud computing node 10 is only one example of a suitable cloud computing node and is not intended to suggest any limitation as to the scope of use or functionality of embodiments of the disclosure described herein. Regardless, cloud computing node 10 is capable of being implemented and performing any of the functionality set forth hereinabove.

In cloud computing node 10 there is a computer system/server 12, which is operational with numerous other general purpose or special purpose computing system environments or configurations. Examples of well-known computing systems, environments, and configurations that may be suitable for use with computer system/server 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random-access memory ("RAM") 30 and cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, system memory 28 may include at least one program product having a set (e.g., at least one) of program modules that are configured to carry out the functions of embodiments of the disclosure.

Program/utility 40, having a set (at least one) of program modules 42, may be stored in system memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and methodologies of embodiments of the disclosure as described herein.

Computer system/server 12 may also communicate with one or more external devices 14 such as a keyboard, a pointing device, a display 24, etc.; one or more devices that enable a user to interact with computer system/server 12; and any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and a public network (e.g., the Internet) via network adapter 20. As depicted, network adapter 20 communicates with the other components of computer system/server 12 via bus 18. It should be understood that although not shown, other hardware and software components could be used in conjunction with computer system/server 12. Examples, include, but are not limited to: microcode, device drivers, redundant processing units, external disk drive arrays, RAID systems, tape drives, and data archival storage systems, etc.

Figure 2:
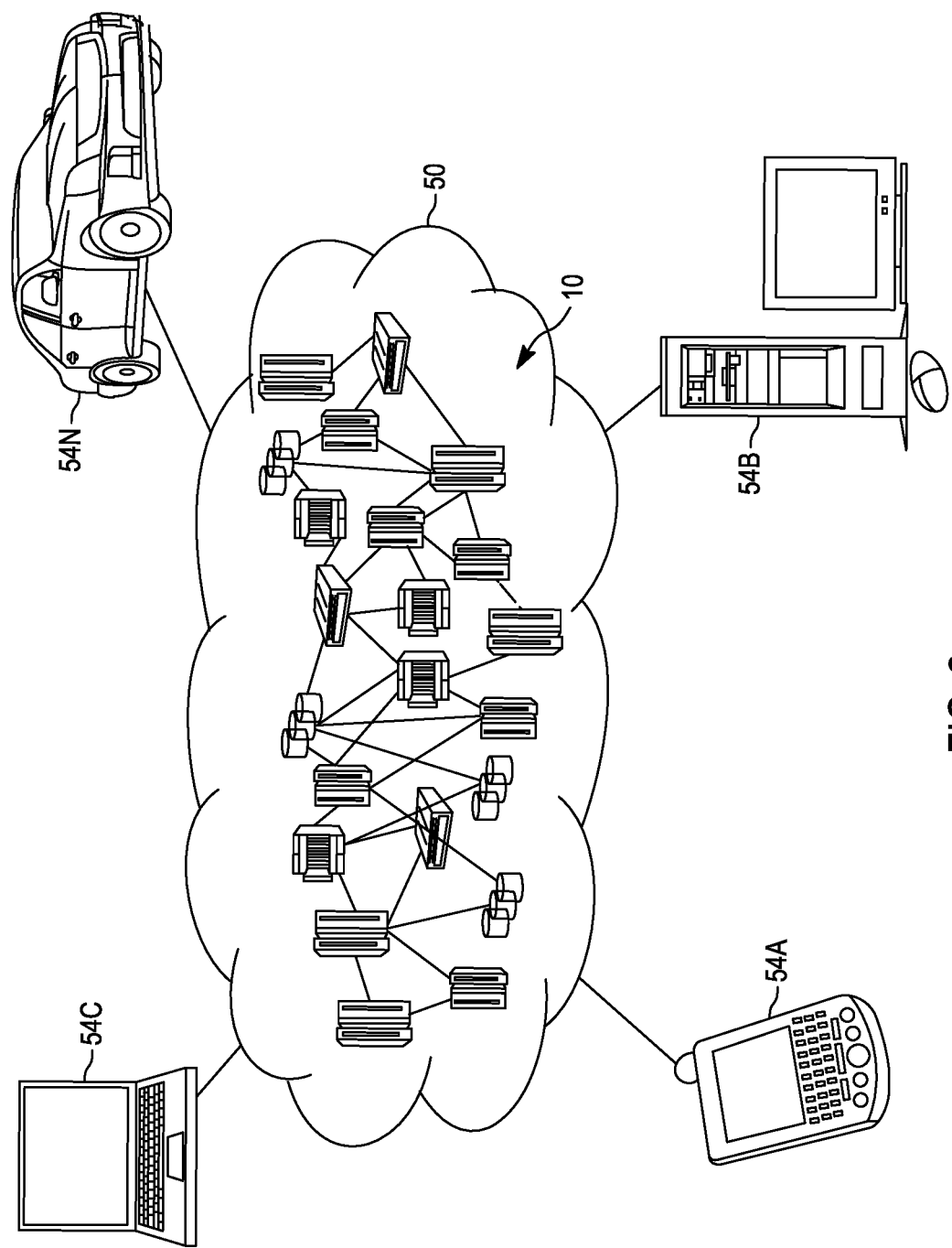
FIG. 2 depicts a cloud computing environment in accordance with some embodiments of the present disclosure.

Referring now to FIG. 2, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and software as services for which a cloud consumer does not need to maintain resources on a local computing device. It is understood that the types of computing devices 54A-N shown in FIG. 2 are intended to be illustrative only and that computing nodes 10 and cloud computing environment 50 can communicate with any type of computerized device over any type of network and network addressable connection (e.g., using a web browser).

Figure 3:
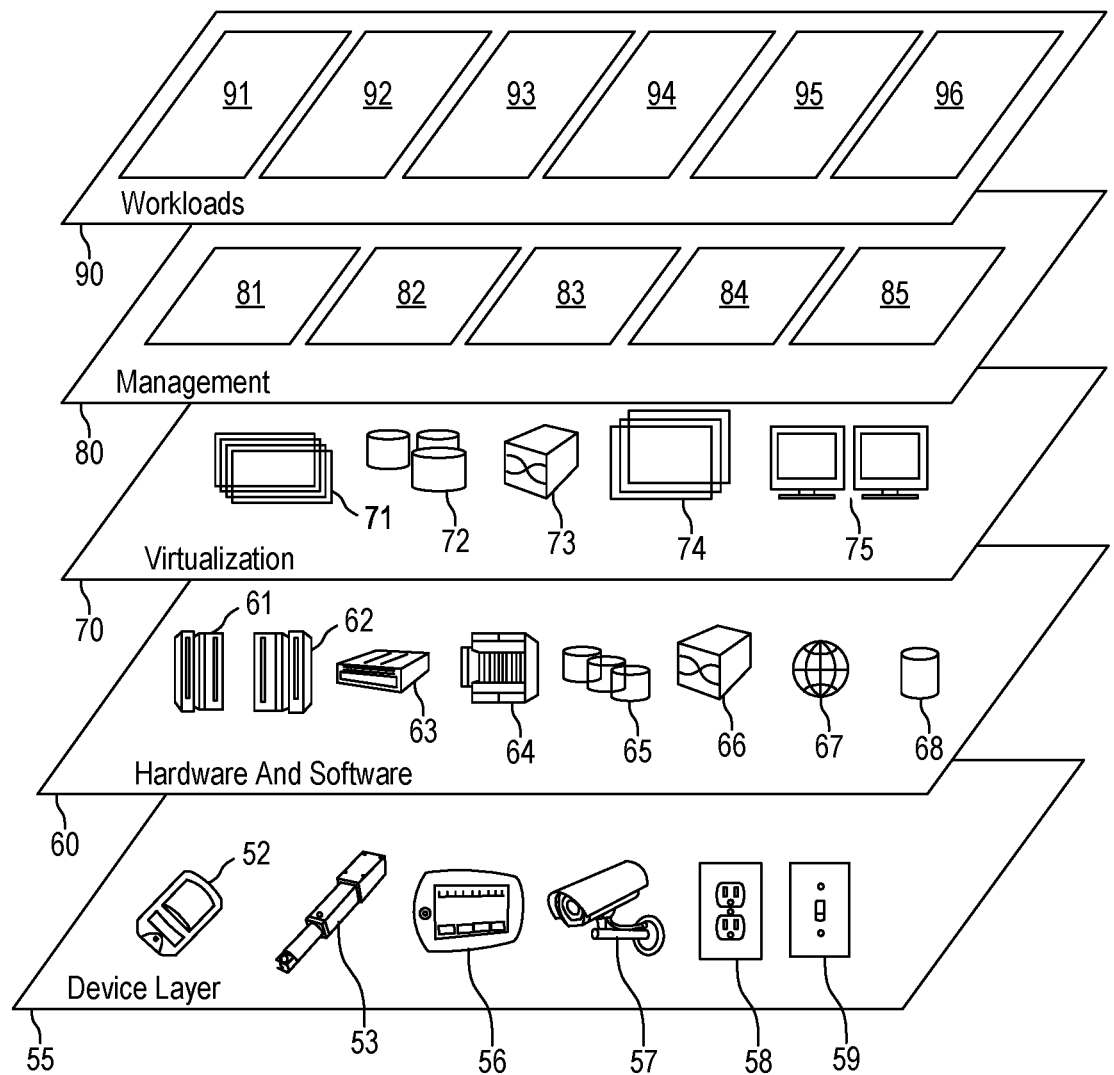
FIG. 3 depicts abstraction model layers in accordance with some embodiments of the present disclosure.

Referring now to FIG. 3, a set of functional abstraction layers provided by cloud computing environment 50 (FIG. 2) is shown. It should be understood that the components, layers, and functions shown in FIG. 3 are intended to be illustrative only and embodiments of the disclosure are not limited thereto. As depicted, the following layers and corresponding functions are provided:

Device layer 55 may include physical devices, virtual devices, or a combination of physical and virtual devices embedded with standalone electronics, sensors, actuators, and other objects to perform various tasks in a cloud computing environment 50. Each of the devices in the device layer 55 incorporates networking capability to other functional abstraction layers such that information obtained from the devices may be provided thereto, and information from the other abstraction layers may be provided to the devices. In one embodiment, the various devices inclusive of the device layer 55 may incorporate a network of entities collectively known as the "internet of things" (IoT). Such a network of entities allows for intercommunication, collection, and dissemination of data to accomplish a great variety of purposes, as one of ordinary skill in the art will appreciate.

Device layer 55 as shown includes sensor 52, actuator 53, "learning" thermostat 56 with integrated processing, sensor, and networking electronics, camera 57, controllable household outlet/receptacle 58, and controllable electrical switch 59 as shown. Other possible devices may include, but are not limited to various additional sensor devices, networking devices, electronics devices (such as a remote-control device), additional actuator devices, so called "smart" appliances such as a refrigerator or washer/dryer, and a wide variety of other possible interconnected objects.

Hardware and software layer 60 includes hardware and software components. Examples of hardware components include: mainframes 61; RISC (Reduced Instruction Set Computer) architecture-based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provides cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provides pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and, in the context of the illustrated embodiments of the present disclosure, various workloads and functions 96 for on-chip spread spectrum synchronization between spread spectrum sources in a computing environment. In addition, workloads and functions 96 for on-chip spread spectrum synchronization between spread spectrum sources may include such operations as obtaining, identifying, determining, and synchronizing, and as will be further described, user and device management functions. One of ordinary skill in the art will appreciate that the workloads and functions 96 for on-chip spread spectrum synchronization between spread spectrum sources may also work in conjunction with other portions of the various abstractions layers, such as those in hardware and software 60, virtualization 70, management 80, and other workloads 90 (such as data analytics processing 94, for example) to accomplish the various purposes of the illustrated embodiments of the present disclosure.

As previously stated, the present disclosure provide mechanisms for on-chip spread spectrum synchronization between spread spectrum sources. That is, various embodiments, as described herein, provide for the ability to synchronize spread spectrum sources. In some implementations, delay lines are used to capture a master clock's full spread spectrum amplitude. Accompanied with each delay line is a latch that is clocked using the slave's feedback clock, and combinational logic to find clock edges. The edge data is then fed to a 'sticky latch' to capture the spread spectrum width (amplitude) of the master clock. Using combinational logic, one of the delay lines is identified, which corresponds to a falling edge of the master clock's spread width. The falling edge corresponds to a smallest phase error, or the center frequency of a 'middle spread' spread spectrum clock. Additional combinational logic is used to wait for the master clock's spread to reach the delay line, which corresponds to the center frequency. A 'Spread Enable" signal is brought high once the edge is identified at the correctly, identified delay line, which corresponds to the center frequency. The spread enable signal activates a spread spectrum logic for a slave clock to synchronizing the two sources (e.g., the master clock and the slave clock). Each of these operations may be repeated to measure a phase error between the two sources, which may be determined by once again measuring the spread width of the spread spectrum amplitude. The spread width may be one delay element in size if the master and slave clocks are properly aligned. Thus, the mechanisms for on-chip spread spectrum synchronization between spread spectrum sources provide the ability to synchronize multiple spread spectrum clocks without the need for a TOD clock or other scheme that must be routed synchronously to all phase-locked loops (PLLs) within a system.

In some computing system designs, processors (such as processor 16 of FIG. 1) include on-chip spread spectrum clocks. Within these processors, phase-locked loops (PLLs) are used to apply a spread spectrum to a clock signal. A spread spectrum is a deterministic frequency component added to the clock signal to distribute the power of the signal more evenly over a number of frequencies of the clock signal. As used herein, spread spectrum refers to both a deterministic spread spectrum signal intentionally added to a clock signal and a deterministic jitter unintentionally added to a clock signal.

Evaluating the on-chip spread spectrum clocks ensures the PLL health and stable clock grids. However, the on-chip generated spread spectrum clocks may be difficult to characterize. Specifically, once a clock signal has undergone the addition of a spread spectrum by a PLL, determining whether the addition of the spread spectrum was successful, and whether the spread spectrum clock signal is consistent with the intended effect of the PLL(s), may be difficult.

Also, it should be noted that as used herein, various hardware components are depicted that include a set of delay elements, latches, and combinational logic to detect clock edges and spread width and provided additional combinational logic to detect when a spread spectrum clock has reached the center frequency and to synchronize spread spectrum sources. Also, it may be assumed, as used herein, that the spread spectrum amplitude and frequency are identical for all sources and each of the sources "middle spread," which means the spread spectrum starts at a center frequency and spreads up and then down.

Additionally, as used herein, one or more voltage-controlled oscillators ("VCO's) may be used to generate a slave and master spread spectrum clocks. Each VCO's center frequency is 16 gigahertz ("Ghz"). The slave spread spectrum clock contains a partial feedback loop of a PLL with a prescale divider and a feedback divider. The feedback clock generated by the feedback divider is used to clock the logic and runs at 100 Mhz. The master clock represents a clock that was generated from another spread spectrum source. This master clock is divided down to 1 Ghz and sent to the delay lines. In some implementations, the master clock and the slave clock each contain a spread spectrum generator. The spread spectrum generator simply sweeps the control voltage of the VCO. In some implementations, the spread frequency is 512 Khz and amplitude is 0.1% spread. In some implementations, the center frequency is 16 Ghz.

Figure 4:
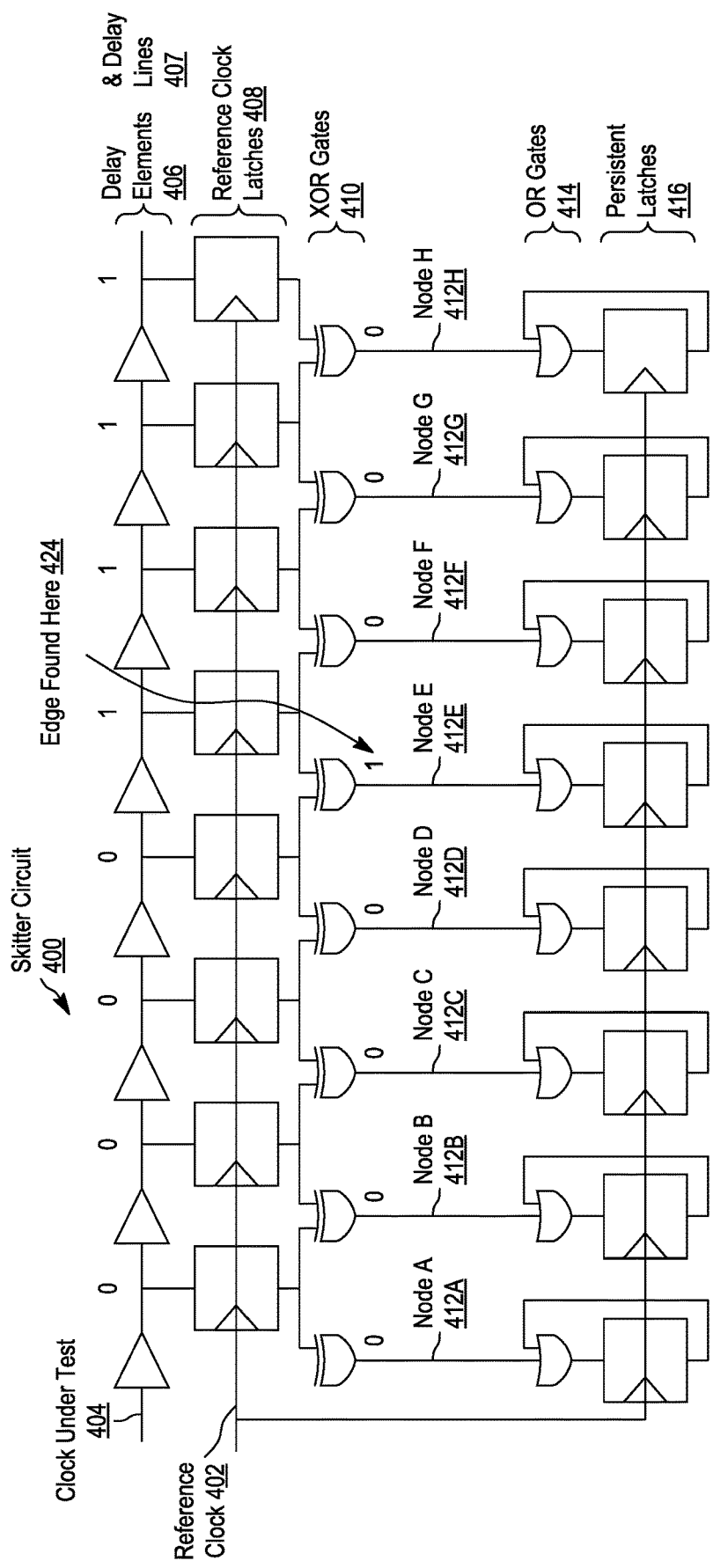
FIG. 4 sets forth a circuit diagram of an example system configured for single edge detection of on-chip spread spectrum characterization according to embodiments of the present invention.

FIG. 4 shows an exemplary circuit for on-chip spread spectrum characterization according to embodiments of the present invention. As shown in FIG. 4, the exemplary skitter circuit 400 includes a reference clock 402 (e.g., a spread spectrum slave clock) line, a clock under test 404 (e.g., a master spread spectrum clock) line, delay elements 406, reference clock latches 408, exclusive OR XOR gates 410, OR gates 414, persistent latches 416, and a set of nodes node A 412A, node B 412B, node C 412C, node D 412D, node E 412E, node F 412F, node G 412G, node H 412H between the XOR gates 410 and OR gates 414. Although a limited number of elements are shown in the exemplary skitter circuit 400 of FIG. 4, a skitter circuit may include elements sufficient to capture at least one period of the clock under test signal.

The reference clock 402 line is a signal line that carries a reference clock signal. The reference clock signal is the clock signal to which a clock under test signal is compared.

The reference clock signal may be generated from an off-chip oscillator. The reference clock signal may be the clock signal before undergoing the addition of a spread spectrum by a PLL or being subjected to a process that causes the unintentional addition of jitter to the clock signal.

The clock under test 404 line is a signal line that carries a clock under test signal. The clock under test signal may be a spread spectrum clock signal. Specifically, the clock under test signal may be the result of a clock signal (such as the reference clock signal undergoing the addition of a spread spectrum by a PLL. The clock under test signal may also be the result of a clock signal (such as the reference clock signal) being subjected to a process that causes the unintentional addition of jitter to the clock signal.

The delay elements 406, which include delay lines 407, are circuits or components that receive the clock under test signal from the clock under test 404 line. The delay elements 406 delay the clock under test signal such that data corresponding to a portion of the clock under test signal may be captured by the reference clock latches 408.

The reference clock latches 408 store data corresponding to a portion of the clock under test signal measured during one reference clock cycle. After each reference clock cycle, the reference clock latches 408 store a snapshot of the clock under test signal during the reference clock cycle. Specifically, the reference clock latches 408 store data indicating whether the clock under test signal was high or low at each point within the series of delay elements 406. For example, after a first clock cycle, the reference clock latches 408 may store, cumulatively, '00011111'. After a second clock cycle, the reference clock latches 408 may store, cumulatively, '00111111'. After a third clock cycle, the reference clock latches 408 may store, cumulatively, '01111111'.

The XOR gates 410 are used to locate an edge of the clock under test signal for each reference clock cycle. The XOR gates 410 compare the data stored in each reference clock latch 408 to the neighboring reference clock latch 408 to determine whether the data has shifted from high to low or low to high. Using the example above, after the first reference clock cycle, the XOR gates 410 may output, cumulatively, '00010000'. After the second reference clock cycle, the XOR gates 410 may output, cumulatively, '00100000'. After the third reference clock cycle, the XOR gates 410 may output, cumulatively, '01000000'.

The OR gates 414 and the persistent latches 416 continuously store all high signals received during the set of reference clock cycles. Using the example above, after the first reference clock cycle, the persistent latches 416 store, cumulatively, '00010000'. After the second reference clock cycle, the persistent latches 416 store, cumulatively, '00110000'. After the third reference clock cycle, the persistent latches 416 store, cumulatively, '01110000'.

After a number of reference clock cycles is allowed to run, OR gates 414 and the persistent latches 416 store skitter data. Skitter data is a collection of data describing the spread spectrum of a spread spectrum clock signal. Specifically, skitter data includes a spread width that corresponds to an amplitude of a spread of a spread spectrum clock signal. Continuing with the above example, the skitter data produced after the third clock cycle is '01110000'. This example skitter data includes a spread width of three high signals. Using the spread width of three high signals, the amplitude may be calculated by multiplying the spread width by the buffer delay of the delay elements.

The set of nodes node A 412A, node B 412B, node C 412C, node D 412D, node E 412E, node F 412F, node G 412G, node H 412H between the XOR gates 410 and OR gates 414 are points within the skitter circuit 400 from which edge data may be gathered from the skitter circuit 400. The edge data indicates a relative location of the edge of the clock under test during a reference clock cycle. If the clock under test signal is a spread spectrum clock signal, the edge data indicates a location, within the spread width, of an edge of the spread spectrum during the reference clock cycle.

The set of nodes may be used to capture the output of the XOR gates 410 in order to store data corresponding to the relative location of the edge of the clock under test during each reference clock cycle. As discussed in the example above, after the first reference clock cycle, the set of nodes may be used to capture, cumulatively, '00010000'. After the second reference clock cycle, the set of nodes may be used to capture, cumulatively, '00100000'. After the third reference clock cycle, the set of nodes may be used to capture, cumulatively, '01000000'.

Each edge data may be retrieved from the skitter circuit for a single clock cycle. Specifically, each unit of edge data refers to a collection of data retrieved during a single reference clock cycle in contrast to skitter data that is a collection of data retrieved after multiple reference clock cycles. Edge data may refer to data for a single reference clock cycle retrieved from the set of nodes node A 412A, node B 412B, node C 412C, node D 412D, node E 412E, node F 412F, node G 412G, node H 412H within the skitter circuit 400.

Figure 5:
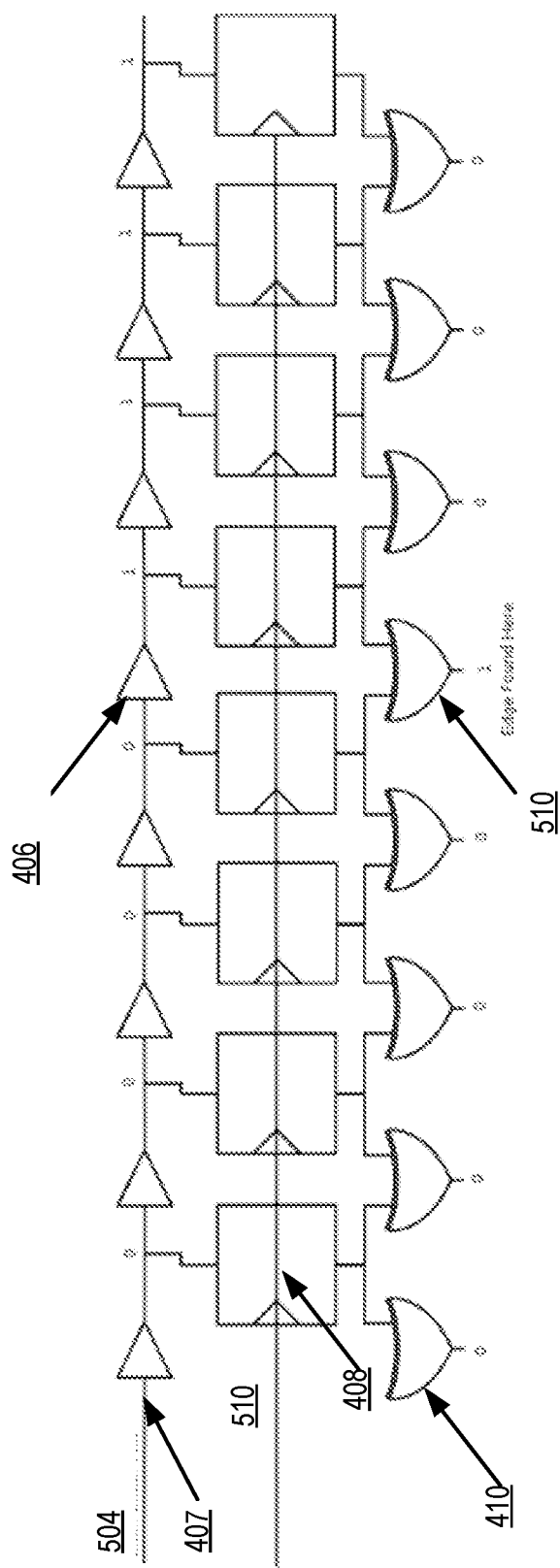
FIG. 5 is a diagram of an example circuit for identifying edges in a spread spectrum signal FIG. 6 sets forth a circuit diagram of an example system configured for on-chip spread spectrum synchronization between spread spectrum sources according to embodiments of the present invention.

FIG. 5 shows how the delay lines 407, latches 408 are clocked by the reference clock signal 512, and XOR gates 410 function to indicate a transition in the spread spectrum clock signal 504. In this example, the spread spectrum clock signal 504 has a "low" state prior to one of the delay elements such as, for example, delay element 406, indicated by a "0." The spread spectrum clock signal 504 has a "high" state after to the delay element 406, indicated by a "1." The output of the respective latches 408 are provided as input to the XOR gates 410 such that the output of the XOR gate 510 is a "1," indicating the edge transition from "low" to "high."

Figure 6:
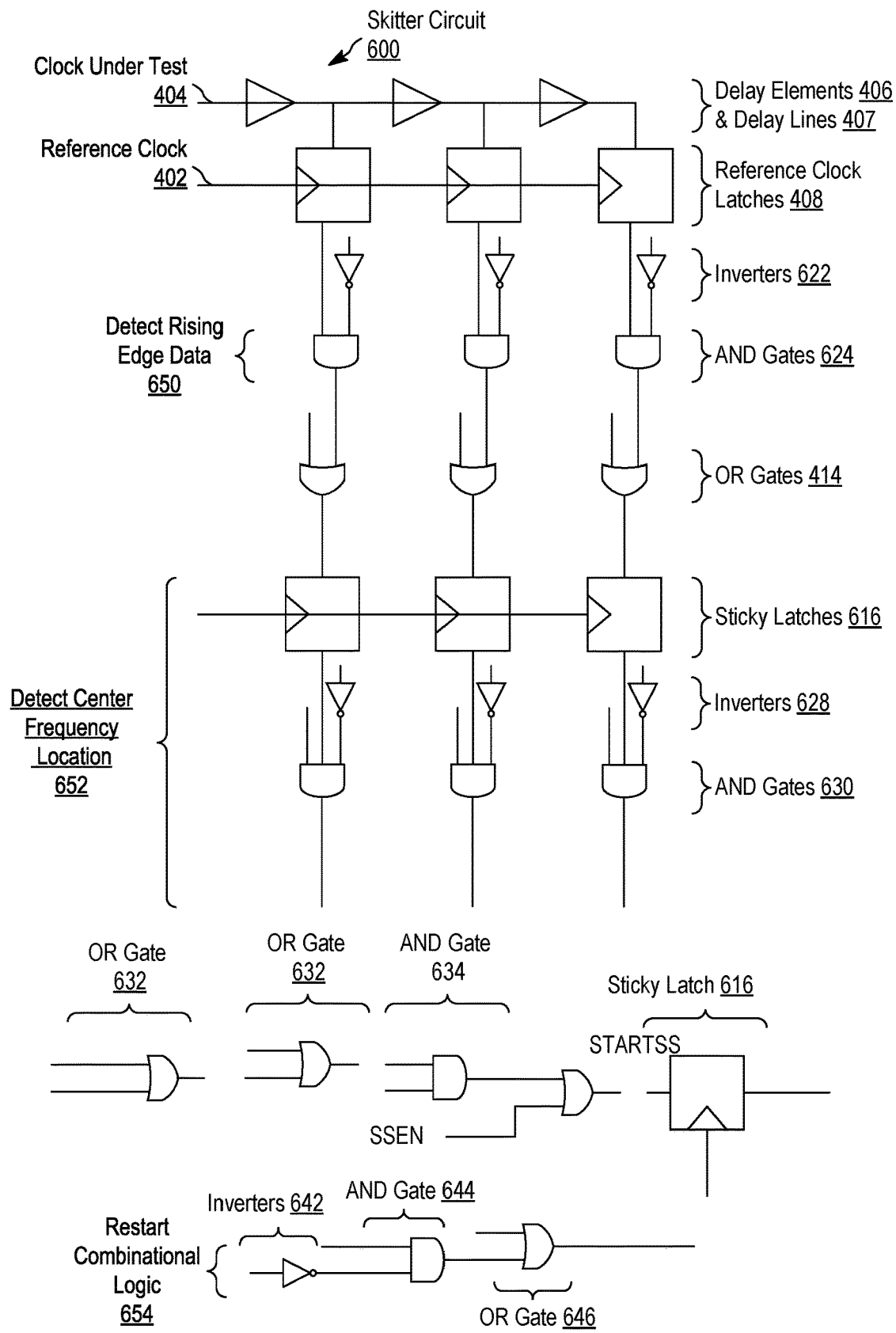

FIG. 6 shows an exemplary circuit for on-chip spread spectrum synchronization between spread spectrum sources according to embodiments of the present invention. As shown in FIG. 6, the exemplary skitter circuit 600 includes the reference clock 402 line, the clock under test 404 line, delay elements 406, reference clock latches 408, inverters 622, AND gates 624, OR gates 414, sticky latches 616, inverters 628, AND gates 630, OR gates 632, and AND gates 634.

Figure 7:
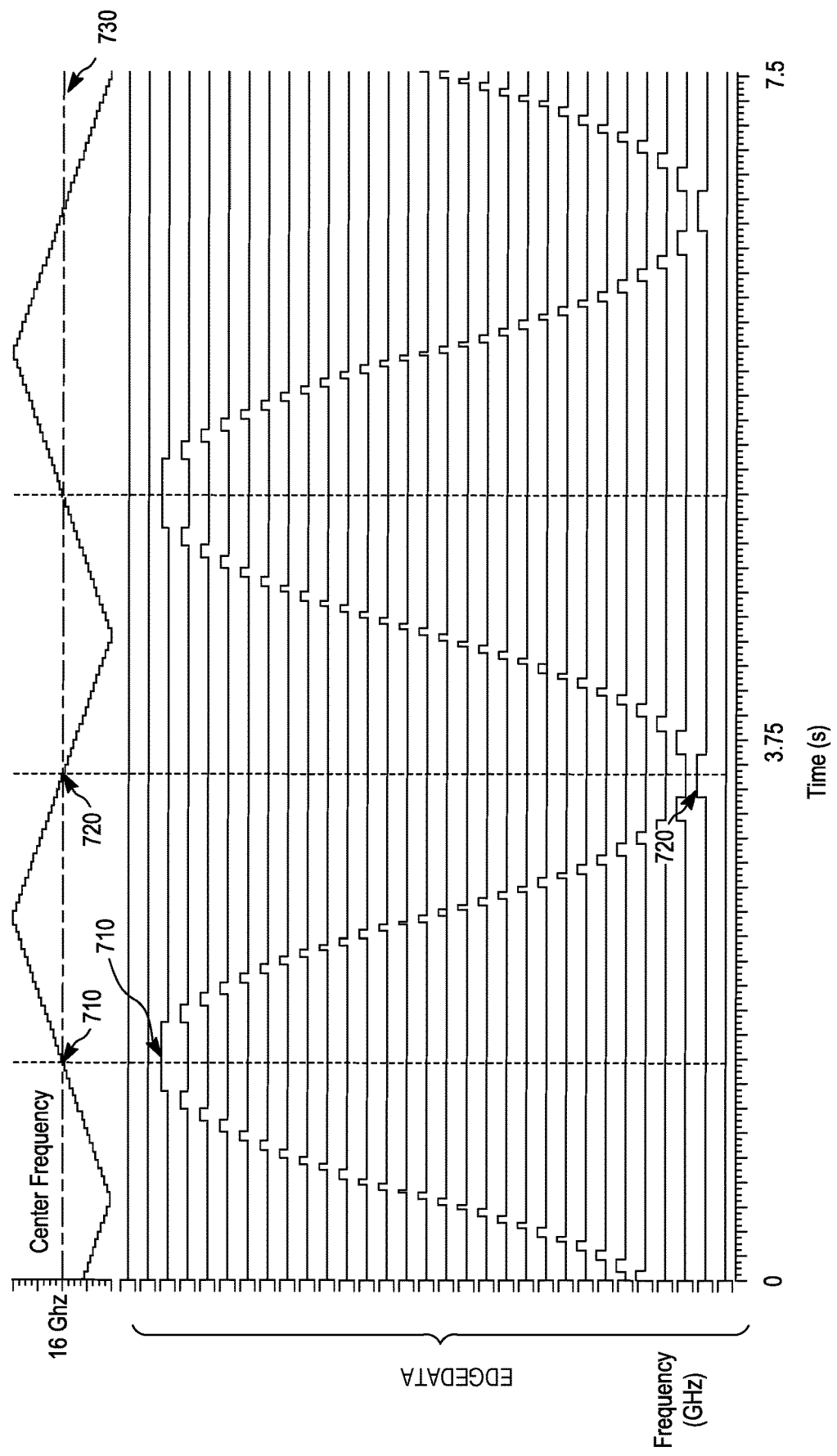
FIG. 7 sets forth a diagram illustrating capturing edge data for an entire spread width of a reference clock signal according to embodiments of the present invention according to embodiments of the present invention.

The exemplary skitter circuit 600 of FIG. 6 differs from the exemplary skitter circuit 400 of FIG. 4 in that the skitter circuit 600 of FIG. 6 includes the inverters 622, the AND gates 624, the sticky latches 616, the inverters 628, the AND gates 630, the OR gates 632, and the AND gates 620. The skitter circuit 600 of FIG. 6 is a specialized version of the skitter circuit 400 of FIG. 4 and reconfigured to detect the rising edge data using combinational logic 650 of the signal on the clock under test 404 line including the falling edge or only the falling edge of the signal on the clock under test 404 line including the rising edge. The falling edge corresponds to a center frequency (as depicted in FIG. 7) of a center spread of the spread width of the signal of the spread spectrum reference clock. Also, the skitter circuit 600 of FIG. 6 detects the center frequency location using additional combinational logic 652. The skitter circuit 600 of FIG. 6 also differs from the exemplary skitter circuit 400 of FIG. 4 in that the skitter circuit 600 of FIG. 6 uses OR gates 632 to OR all center frequency data coming from the AND gates 630 and then the AND gates 634 are used to AND the spread enable signal ("SSEN") to initiate and activate the spread spectrum signal ("STARTSS") to synchronize the signal of the master clock 404 (e.g., master clock) with the reference clock 402 (e.g., the spread spectrum slave clock).

In some implementations, the master clock 404 represents a clock that was generated from another spread spectrum source. This master clock 404 is divided down to 1 Ghz and sent to the delay lines 407. In some implementations, the master clock 404 and the slave clock 402 each contain a spread spectrum generator. The spread spectrum generator sweeps, for example, the control voltage of the VCO (not shown for illustrative convenience). In some implementations, the spread frequency is 512 Khz and amplitude is 0.1% spread. In some implementations, the center frequency is 16 Ghz.

The delay lines 407 are used to capture a master clock's (e.g., the clock under test 404) full spread spectrum amplitude. Accompanied with each delay line 407 is a latch (e.g., each of the latches 408) that is clocked using the slave's feedback clock (e.g., reference clock 402), and combinational logic 650 to find clock edges.

In some implementations, the master clock's 404 spectrum clock signal of FIG. 6 such as depicted in the spread spectrum clock signal 504 of FIG. 5, has a "low" state prior to one of the delay elements such as, for example, delay element 406, indicated by a "0." The spread spectrum clock signal of FIG. 6 such as depicted in the spread spectrum clock signal 504 of FIG. 5, also has a "high" state after one of the delay elements such as, for example, the delay element 406 of FIG. 5, indicated by a "1." However, unlike FIG. 5, in some implementations, the output of the respective latches 408 in FIG. 6 are provided as input to the combinational logic 650.

The combinational logic 650 may include the inverters 622, the AND gates 624, and the OR gates 414. The inverters 622 provide the inverse of the signal stored in each reference clock latch 408 for comparison to the signal stored in each adjacent reference clock latch 408. The AND gates 624 compare the signal in each reference clock latch 408 to the inverse of the signal stored in the adjacent reference clock latch 408. The combinational logic 650 may be used to identify the edges of the master clock's 404 spectrum clock signal.

The edge data, detected in the combinational logic 650, is then fed to the sticky latches 616 to capture the spread spectrum width (amplitude) of the master clock 404. Also, the combinational logic 650 is used to identify one of the delay lines 407, which corresponds to a falling edge of the master clock's spread width. The falling edge corresponds to a smallest phase error, or the center frequency of a 'middle spread' spread spectrum clock.

The sticky latch data of the sticky latches 616 is then fed to additional combinational logic 652 to determine the falling edge of the spread width (left most bit). As stated previously, the left and right most bit of the sticky data corresponds to a center frequency due to the master clock 404 being center spread, as depicted in FIG. 7. The sticky data falling edge (e.g., a left most bit) corresponds to the smallest phase error, i.e., the center frequency at which the spread is transitioning from low to high. The sticky data rising edge (e.g., right most bit) corresponds to the largest phase error (i.e., the center frequency at which the spread is transitioning from high to low).

Again, the combinational logic 652 may include inverting the $n_{th-1}$ sticky latch of the sticky latches 616 and AND'ed (e.g., AND logic operation) with the $n_{th}$ sticky latch sticky latch of the sticky latches 616 along with the $n_{th}$ edge data.

The combinational logic 652 identifies the delay line associated with the center frequency and detects when the master clock is at the center frequency. The output of this combinational logic 652 (e.g., center frequency data) will go high only when the master clock is at the center frequency.

The additional combinational logic 652 is used to wait for the master clock's 404 spread signal to reach the delay line, which corresponds to the center frequency, as depicted in FIG. 7. That is, the additional combinational logic 652 may wait for the spread width of the signal of the spread spectrum reference clock to reach a center frequency to capture the spread width. In some implementations, the additional combinational logic 652 may initiate an upward rise of the spread spectrum signal of the spread spectrum slave clock at the center frequency of the center spread of the spread width based on the signal of the spread spectrum reference clock reaching the center frequency. That is, a spread enable signal ("SSEN") is brought high once the edge is identified at the correctly, identified delay line, which corresponds to the center frequency.

The additional combinational logic 652 is used to synchronize the spread spectrum signal of a spread spectrum slave clock 402 with the signal of the spread spectrum reference clock (e.g., the master clock 404) based on the delay line. More specifically, the outputs of the additional combinational logic 652 may provide to the OR gates 632, which then send the output to the AND gate 634. The spread spectrum signal ("STARTSS") may then be initiated using sticky latch 616.

In some implementations, the additional combinational logic 652 uses the center frequency data (e.g., the output data of the AND gates 630) and performs an OR operation using the OR gates 632 and OR'd together and AND'ed (e.g., AND logic operation) with a spread enable signal ("SSEN") to produce the spread spectrum signal (e.g., STARTSS signal). The SSEN signal may be then used to gate the STARTSS signal until the entire spread width is captured. The STARTSS signal is then latched in a sticky latch 618 to kick off spread spectrum on the slave clock 402 side. There is additional reset combinational logic 654 (e.g., inverter 642, AND gate 644, and OR gate 646) to reset the sticky latches 616, which contain the spread width. The spread width should be one delay element in size if the master and slave are truly aligned. This can be used to measure the phase error between the two spread spectrum sources.

For further explanation, FIG. 7 sets forth a diagram illustrating capturing edge data for an entire spread width of a reference clock signal according to embodiments of the present invention. In operation, for example, at time zero (on the x-axis of the graph), for example, the slave clock 402 is static at 16 Ghz to produce a 100 Mhz feedback clock, and the master clock 404 is generating a spread spectrum clock. The master clock 404 is used as the input to the delay lines 407. The delay line data is then latched via the latches 408 using the slaves feedback clock 402.

Next, the nth+1 delay latch from the latches 408 (e.g., the reference clock latches), is inverted and then AND'ed (an AND operation is performed using one of the AND gates 623) with the nth delay latch from the latches 408 to detect a rising edge of the master clock 404 (e.g., "EDGEDATA"). The EDGEDATA, as depicted more clearly in FIG. 7, illustrates the edge moving earlier and later in time as frequency is modulated. The least delay 710 (e.g., a left most bit of EDGEDATA<0:n>) and most delay 720 (e.g., right most bit of EDGEDATA<0:n>) occurs at the center frequency 730 due to center spreading of the master clock 404.

Figure 8:
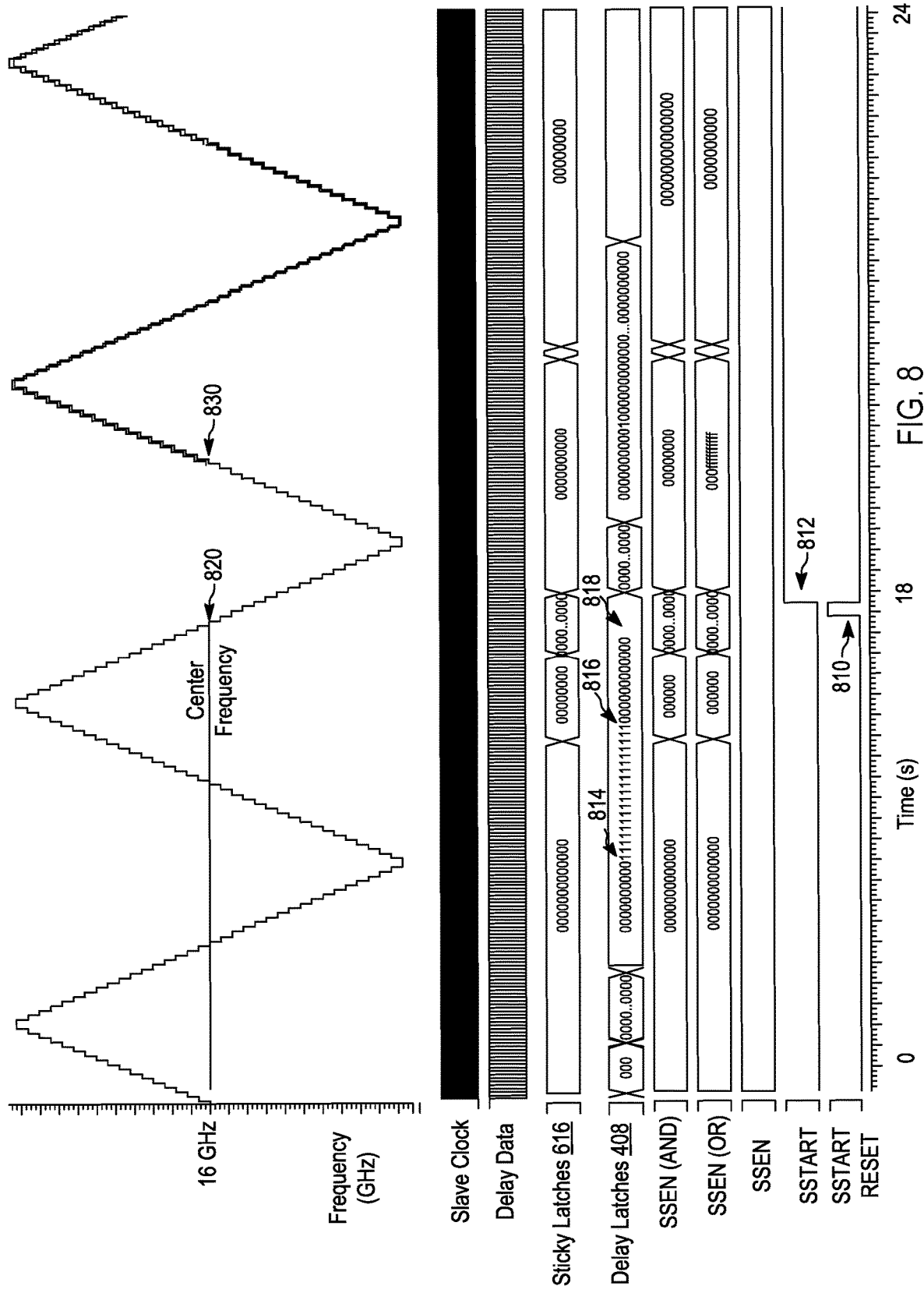
FIG. 8 sets forth a graph diagram illustrating an exemplary method for on-chip spread spectrum characterization according to embodiments of the present invention.

The EDGEDATA is then OR'd (e.g., OR operation is performed using OR gates 414) with the output of the nth sticky latch of the sticky latches 616 to create a 'sticky' latch. This is allowed to run for a period of time (e.g., 10 micro "us" in simulation) in order to capture the entire spread width of the master clock 404. The amount of time required to capture the entire spread width is directly proportional to the spread frequency, as depicted in FIG. 8. For instance, a 512 Khz spread would take 1.95 us to capture.

For further explanation, FIG. 8 sets forth a diagram illustrating capturing an entire spread width 810 of a master clock signal according to embodiments of the present invention. Similar to FIG. 7, in operation, for example, at time zero (on the x-axis of the graph), for example, the slave clock 402 is static at 16 Ghz to produce a 100 Mhz feedback clock, and the master clock 404 is generating a spread spectrum clock. The master clock 404 is used as the input to the delay lines 407. The delay line data is then latched via the latches 408 using the slaves feedback clock 402.

The diagram depicts the slave clock 402, the delay line data, which is always being sampled in FIG. 6, and the entire spread width 818 is depicted. The least delay 814 (e.g., a left most bit of EDGEDATA<0:n>) corresponds to the delay line that corresponds to a center frequency where the spread is transitioning from low to high. The most delay 816 (e.g., right most bit of EDGEDATA<0:n>) occurs at the center frequency 820 due to center spreading of the master clock 404, where the spread is transitioning from high to low. The EDGEDATA is then OR'd (e.g., OR operation is performed using OR gates 414) with the output of the nth sticky latch of the sticky latches 616 to create a 'sticky' latch. This is allowed to run for period of time (e.g., 10 micro "us" in simulation) in order to capture the entire spread width 818 of the master clock 404. The amount of time required to capture the entire spread width is directly proportional to the spread frequency, as depicted in FIG. 8. For instance, a 512 Khz spread would take 1.95 us to capture.

Once the entire spread width 818 is captured, there is a waiting period to set the spread spectrum enable signal high. That is, once the signal of the master clock 404 reaches the center frequency 820, an upward rise of the spread spectrum signal of the spread spectrum reference clock (e.g., reference clock 404) is initiated at a center frequency 830 of a center spread of the spread width based on the signal of the spread spectrum reference clock reaching the center frequency. The one or more sticky latches 616 containing the spread width may be reset.

The delay line (e.g., the least delay 808 bit) associated with the center frequency is identified and the master clock is at the center frequency 820. The output of this combinational logic (e.g., using the center frequency data) will go high only when the master clock is at the center frequency. The center frequency data is then OR'd via gates 632 together and AND'd using AND gate 634 with a SSEN to produce a STARTSS signal. The SSEN signal is used to gate the STARTSS signal until the entire spread width 818 is captured. The STARTSS signal is then latched in a sticky latch 616 to kick off spread spectrum on the slave side. There is additional combinational logic to reset the Sticky Latches which contain the spread width. The spread width should be one delay element in size if the master and slave are truly aligned. This can be used to measure the phase error between the two spread spectrum sources. the phase error between the two spread spectrum sources.

Figure 9:
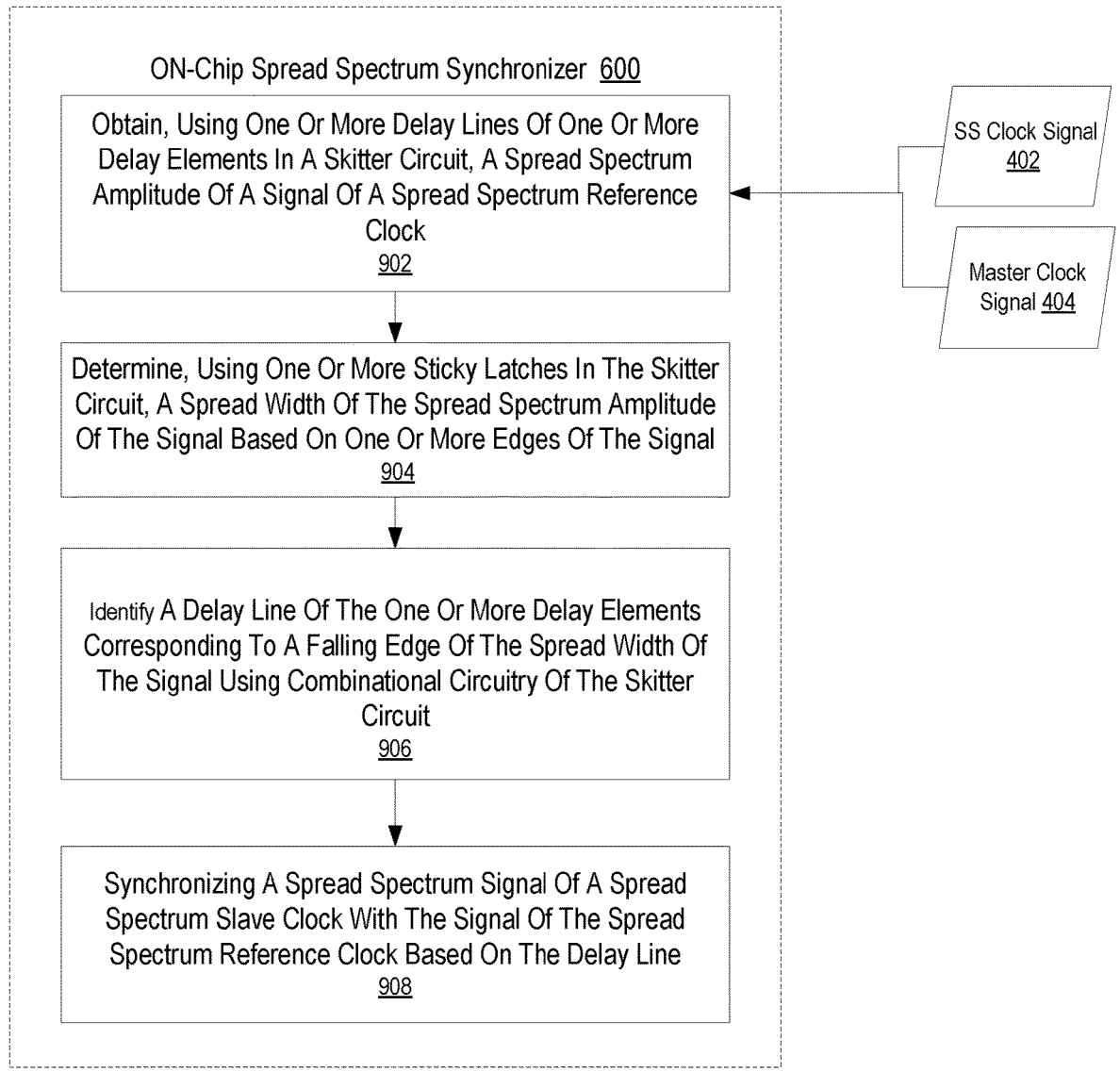
FIG. 9 sets forth a flow chart illustrating an exemplary method for on-chip spread spectrum synchronization between spread spectrum sources according to embodiments of the present invention.

For further explanation, FIG. 9 sets forth a flow chart illustrating an example method of on-chip spread spectrum synchronization between spread spectrum sources in accordance with some embodiments of the present disclosure. The example method of FIG. 9 includes obtaining 902, using one or more delay lines of one or more delay elements in a skitter circuit, a spread spectrum amplitude of a signal of a spread spectrum reference clock.

The example method of FIG. 9 also includes determining 904, using one or more sticky latches in the skitter circuit, a spread width of the spread spectrum amplitude of the signal based on one or more edges of the signal. For example, the sticky latches 616 in the skitter circuit 600 may determine the spread width of the spread spectrum amplitude of the signal based on the edge data being fed to the sticky latches 616 to capture the spread spectrum width (amplitude) of the master clock.

The example method of FIG. 9 also includes identifying 906 a delay line of the one or more delay elements corresponding to a falling edge of the spread width of the signal using combinational circuitry of the skitter circuit. For example, the combinational logic 650 of FIG. 6, may be used to identify one of the delay lines, which corresponds to a falling edge of the spread width of the master clock 404. The falling edge corresponds to a smallest phase error, or the center frequency of a 'middle spread' spread spectrum clock.

The example method of FIG. 9 also includes synchronizing 908 a spread spectrum signal of a spread spectrum slave clock with the signal of the spread spectrum reference clock based on the delay line.

That is, the additional combinational logic 652 of FIG. 6 may be used to synchronize the spread spectrum signal of a spread spectrum slave clock with the signal of the spread spectrum reference clock based on the delay line.

Figure 10:
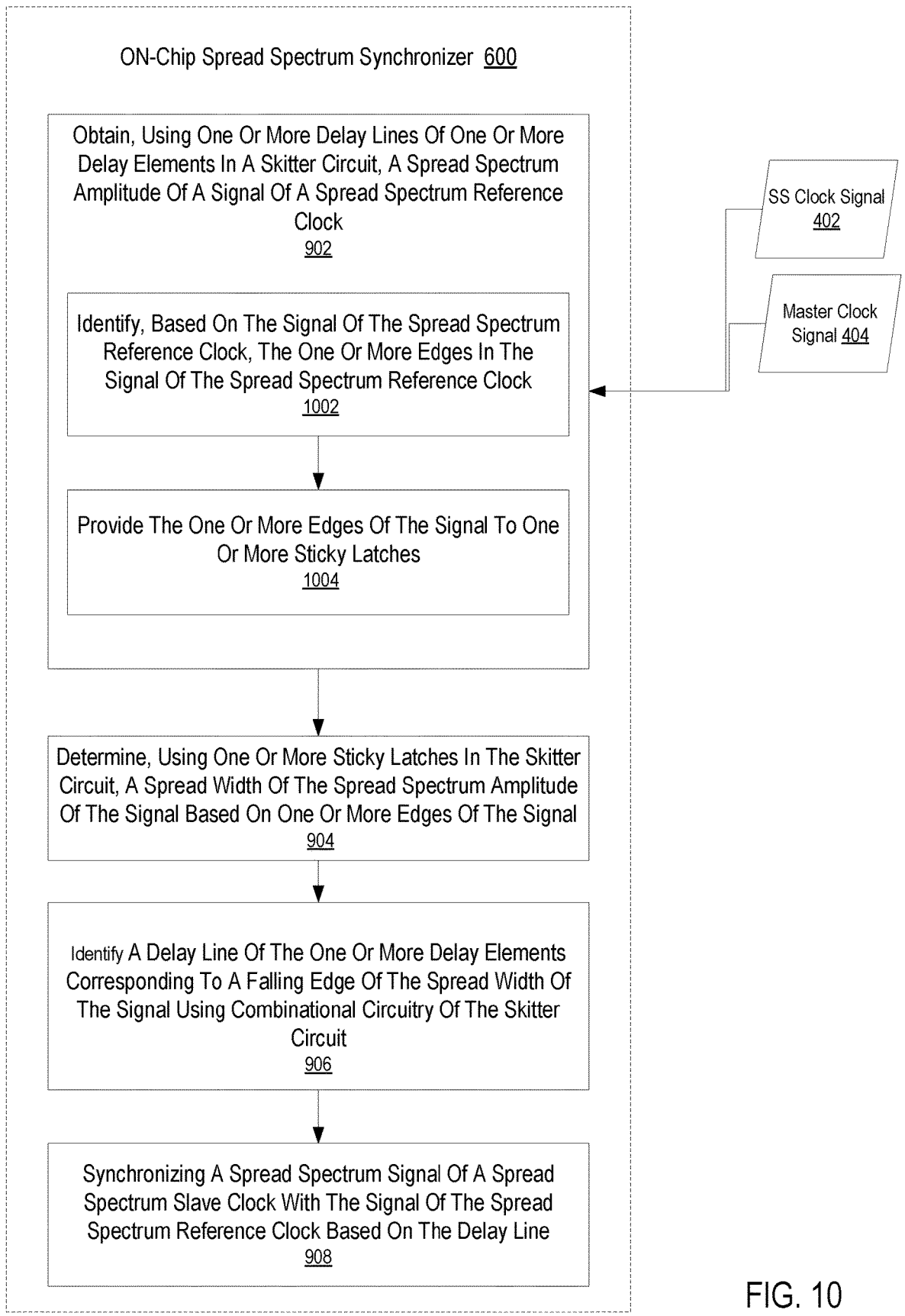
FIG. 10 sets forth a flow chart illustrating an exemplary method for on-chip spread spectrum synchronization between spread spectrum sources according to embodiments of the present invention.

For further explanation, FIG. 10 sets forth a flow chart illustrating an example method of chip spread spectrum synchronization between spread spectrum sources in accordance with some embodiments of the present disclosure. Like the example method of FIG. 9, the example method of FIG. 10 also includes obtaining 902, using one or more delay lines of one or more delay elements in a skitter circuit, a spread spectrum amplitude of a signal of a spread spectrum reference clock; determining 904, using one or more sticky latches in the skitter circuit, a spread width of the spread spectrum amplitude of the signal based on one or more edges of the signal; identifying 906, a delay line of the one or more delay elements corresponding to a falling edge of the spread width of the signal using combinational circuitry of the skitter circuit; and synchronizing 908 a spread spectrum signal of a spread spectrum slave clock with the signal of the spread spectrum reference clock based on the delay line.

The example method of FIG. 10 also includes identifying 1002, based on the signal of the spread spectrum reference clock, the one or more edges in the signal of the spread spectrum reference clock. That is, the data in the latches 408 may be provided as input to the combinational logic 650, where the inverters 622 provide the inverse of the signal stored in each reference clock latch 408 for comparison to the signal stored in each adjacent reference clock latch 408. The AND gates 624 compare the signal in each reference clock latch 408 to the inverse of the signal stored in the adjacent reference clock latch 408. The combinational logic 650 may be used to identify the edges of the master clock's 404 spectrum clock signal. The example method of FIG. 10 also includes providing 1004 the one or more edges of the signal to one or more sticky latches. That is, the output of the OR gates 414 is provided to each of the sticky latches 616 to capture the spread spectrum width (amplitude) of the master clock.

Figure 11:
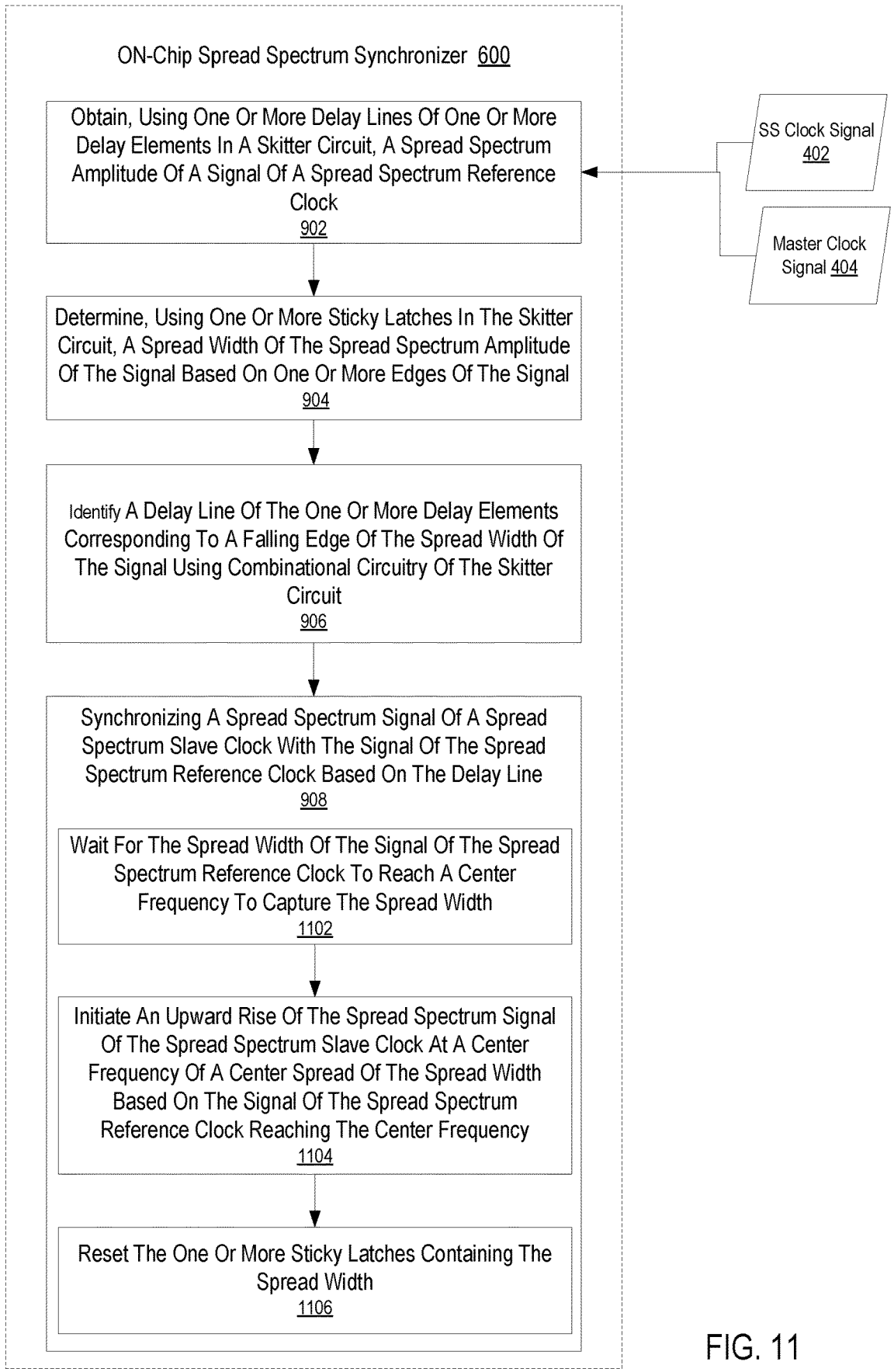
FIG. 11 sets forth a flow chart illustrating an exemplary method for on-chip spread spectrum synchronization between spread spectrum sources according to embodiments of the present invention.

For further explanation, FIG. 11 sets forth a flow chart illustrating an example method of chip spread spectrum synchronization between spread spectrum sources in accordance with some embodiments of the present disclosure. Like the example method of FIG. 9, the example method of FIG. 11 also includes obtaining 902, using one or more delay lines of one or more delay elements in a skitter circuit, a spread spectrum amplitude of a signal of a spread spectrum reference clock; determining 904, using one or more sticky latches in the skitter circuit, a spread width of the spread spectrum amplitude of the signal based on one or more edges of the signal; identifying 906, a delay line of the one or more delay elements corresponding to a falling edge of the spread width of the signal using combinational circuitry of the skitter circuit; and synchronizing 908 a spread spectrum signal of a spread spectrum slave clock with the signal of the spread spectrum reference clock based on the delay line.

The example method of FIG. 11 also includes waiting 1102 for the spread width of the signal of the spread spectrum reference clock to reach a center frequency to capture the spread width. For example, the additional combinational logic 652 may wait for the master clock's spread to reach the delay line, which corresponds to the center frequency.

The example method of FIG. 11 also includes initiating 1104 an upward rise of the spread spectrum signal of the spread spectrum slave clock at the center frequency of the center spread of the spread width based on the signal of the spread spectrum reference clock reaching the center frequency. The example method of FIG. 11 also includes resetting 1106 the one or more sticky latches containing the spread width. The 'spread enable" signal is brought high once the edge is identified at the correctly, identified delay line, which corresponds to the center frequency.

The spread enable signal activates a spread spectrum logic for a slave clock to synchronizing the two sources (e.g., the master clock and the slave clock). Each of these operations may be repeated to measure a phase error between the two sources, which may be determined by once again measuring the spread width of the spread spectrum amplitude. The spread width may be one delay element in size if the master and slave clocks are properly aligned. Thus, the mechanisms for on-chip spread spectrum synchronization between spread spectrum sources provide the ability to synchronize multiple spread spectrum clocks without the need for a TOD clock or other scheme that must be routed synchronously to all phase-locked loops (PLLs) within a system.

Exemplary embodiments of the present invention are described largely in the context of a fully functional computer system for on-chip spread spectrum characterization. Readers of skill in the art will recognize, however, that the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of on-chip spread spectrum synchronization between spread spectrum sources, the method comprising:
   obtaining, using one or more delay lines of one or more delay elements in a skitter circuit, a spread spectrum amplitude of a signal of a spread spectrum reference clock;
   determining, using one or more sticky latches in the skitter circuit, a spread width of the spread spectrum amplitude of the signal based on one or more edges of the signal;
   identifying a delay line of the one or more delay elements corresponding to a falling edge of the spread width of the signal using combinational circuitry of the skitter circuit; and
   synchronizing a spread spectrum signal of a spread spectrum slave clock with the signal of the spread spectrum reference clock based on the delay line.

2. The method of claim 1, further comprising identifying, based on the signal of the spread spectrum reference clock, the one or more edges in the signal of the spread spectrum reference clock.

3. The method of claim 1, further comprising providing the one or more edges of the signal to one or more sticky latches.

4. The method of claim 1, wherein the falling edge corresponds to a center frequency of a center spread of the spread width of the signal of the spread spectrum reference clock.

5. The method of claim 1, wherein synchronizing the spread spectrum signal of the spread spectrum slave clock with the signal of the spread spectrum reference clock based on the delay line further includes waiting for the spread width of the signal of the spread spectrum reference clock to reach a center frequency to capture the spread width.

6. The method of claim 1, wherein synchronizing the spread spectrum signal of the spread spectrum slave clock with the signal of the spread spectrum reference clock based on the delay line further includes initiating an upward rise of the spread spectrum signal of the spread spectrum slave clock at a center frequency of a center spread of the spread width based on the signal of the spread spectrum reference clock reaching the center frequency.

7. The method of claim 1, further including resetting the one or more sticky latches containing the spread width.

8. An integrated circuit for on-chip spread spectrum synchronization between spread spectrum sources, the integrated circuit configured to carry out the steps of:
   obtaining, using one or more delay lines of one or more delay elements in a skitter circuit, a spread spectrum amplitude of a signal of a spread spectrum reference clock;
   determining, using one or more sticky latches in the skitter circuit, a spread width of the spread spectrum amplitude of the signal based on one or more edges of the signal;
   identifying a delay line of the one or more delay elements corresponding to a falling edge of the spread width of the signal using combinational circuitry of the skitter circuit; and
   synchronizing a spread spectrum signal of a spread spectrum slave clock with the signal of the spread spectrum reference clock based on the delay lines.

9. The integrated circuit of claim 8, wherein the integrated circuit is further configured to carry out the steps of identifying, based on the signal of the spread spectrum reference clock, the one or more edges in the signal of the spread spectrum reference clock.

10. The integrated circuit of claim 8, wherein the integrated circuit is further configured to carry out the steps of providing the one or more edges of the signal to one or more sticky latches.

11. The integrated circuit of claim 8, wherein the falling edge corresponds to a center frequency of a center spread of the spread width of the signal of the spread spectrum reference clock.

12. The integrated circuit of claim 8, wherein synchronizing the spread spectrum signal of the spread spectrum slave clock with the signal of the spread spectrum reference clock based on the delay line further includes waiting for the spread width of the signal of the spread spectrum reference clock to reach a center frequency to capture the spread width.

13. The integrated circuit of claim 8, wherein synchronizing the spread spectrum signal of the spread spectrum slave clock with the signal of the spread spectrum reference clock based on the delay line further includes initiating an upward rise of the spread spectrum signal of the spread spectrum slave clock at a center frequency of a center spread of the spread width based on the signal of the spread spectrum reference clock reaching the center frequency.

14. The integrated circuit of claim 8, wherein the integrated circuit is further configured to carry out the steps of resetting the one or more sticky latches containing the spread width.

15. A computer program product for on-chip spread spectrum synchronization between spread spectrum sources, the computer program product comprising one or more computer readable storage media, and program instructions collectively stored on the one or more computer readable storage media, the program instruction comprising:
  program instructions to obtain, using one or more delay lines of one or more delay elements in a skitter circuit, a spread spectrum amplitude of a signal of a spread spectrum reference clock;
  program instructions to determine, using one or more sticky latches in the skitter circuit, a spread width of the spread spectrum amplitude of the signal based on one or more edges of the signal;
  program instructions to identify a delay line of the one or more delay elements corresponding to a falling edge of the spread width of the signal using combinational circuitry of the skitter circuit; and
  program instructions to synchronize a spread spectrum signal of a spread spectrum slave clock with the signal of the spread spectrum reference clock based on the delay line.

16. The computer program product of claim 15, further including program instructions to identify, based on the signal of the spread spectrum reference clock, the one or more edges in the signal of the spread spectrum reference clock.

17. The computer program product of claim 15, further including program instructions to provide the one or more edges of the signal to one or more sticky latches.

18. The computer program product of claim 15, wherein the falling edge corresponds to a center frequency of a center spread of the spread width of the signal of the spread spectrum reference clock.

19. The computer program product of claim 15, wherein synchronizing the spread spectrum signal of the spread spectrum slave clock with the signal of the spread spectrum reference clock based on the delay line further includes:
  waiting for the spread width of the signal of the spread spectrum reference clock to reach a center frequency to capture the spread width; and
  initiating an upward rise of the spread spectrum signal of the spread spectrum slave clock at the center frequency of the center spread of the spread width based on the signal of the spread spectrum reference clock reaching the center frequency.

20. The computer program product of claim 15, further including program instructions to reset the one or more sticky latches containing the spread width.

* * * * *